United States Patent [19]

Hsu

[11] Patent Number: 4,876,215
[45] Date of Patent: Oct. 24, 1989

[54] METHOD OF MAKING A STATIC RAM CELL WITH TRENCH PULL-DOWN TRANSISTORS AND BURIED-LAYER GROUND PLATE

[75] Inventor: Fu-Chieh Hsu, Cupertino, Calif.

[73] Assignee: Integrated Device Technology, Inc., Santa Clara, Calif.

[21] Appl. No.: 236,209

[22] Filed: Aug. 23, 1988

Related U.S. Application Data

[62] Division of Ser. No. 69,168, Jul. 2, 1987.

[51] Int. Cl.⁴ .................. H01L 21/425; H01L 21/38
[52] U.S. Cl. ...................................... 437/60; 437/47; 437/52; 437/918; 437/191; 437/193
[58] Field of Search .............. 437/918, 47, 60, 40, 437/41, 52, 56, 57, 193, 191; 357/51

[56] References Cited

U.S. PATENT DOCUMENTS

| | | | |
|---|---|---|---|
| 4,105,475 | 8/1978 | Jenne | 437/60 |
| 4,194,283 | 3/1980 | Hoffmann | 437/203 |
| 4,326,332 | 4/1982 | Kenney | 437/60 |
| 4,453,175 | 6/1984 | Ariizumi et al. | 357/51 |
| 4,455,740 | 6/1984 | Iwai | 437/203 |
| 4,481,524 | 11/1984 | Isujicle | 357/51 |
| 4,609,835 | 9/1986 | Sakai et al. | 357/51 |
| 4,797,717 | 1/1989 | Isibashi et al. | 357/51 |

FOREIGN PATENT DOCUMENTS 0239660 10/1986 Japan .................................. 357/23.5

OTHER PUBLICATIONS

Rodgers, "Umos Memory Technology", IEEE J. of Solid-State Circuits, SC-12, No. 5, Oct. 77, pp. 515-523.
Amir, "U-MOS Packs 16 Kilobits Into Static Random-Access Memory", Electronics, May 24, 1979, pp. 137-141.
Schuster, "Single U-Groove High Density Static Random-Access Memory Cell", IBM TDB, vol. 22, No. 3, Aug. 1979, pp. 1282-1283.

Primary Examiner—Brian E. Hearn
Assistant Examiner—Tom Thomas
Attorney, Agent, or Firm—Thomas E. Schatzel

[57] ABSTRACT

Disclosed is a (4T-2R) SRAM cell and method which achieves a much reduced cell area through the combined use of vertical trench pull-down n-channel transistors and a buried-layer ground plate. The reduced cell area allows the fabrication of a higher density SRAM for a given set of lithographic rules. The cell structure also allows the implementation of a (6T) SRAM cell with non-self-aligned polysilicon p-channel pull-up transistors without appreciably enlarging the cell area.

5 Claims, 3 Drawing Sheets

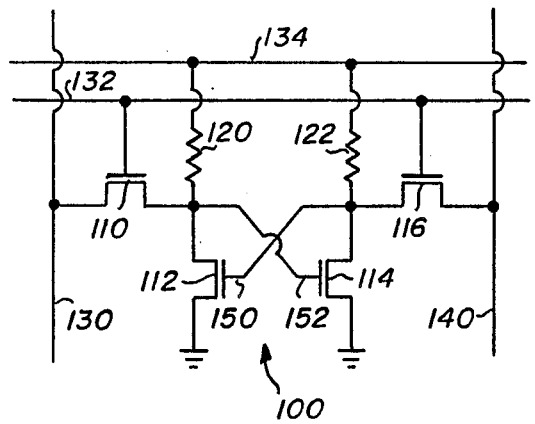
Fig_1 PRIOR ART
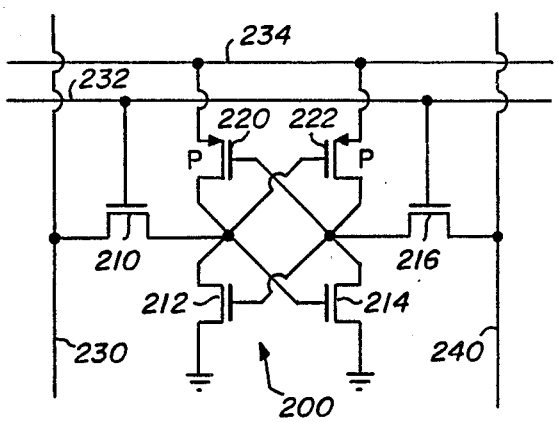
Fig_2 PRIOR ART
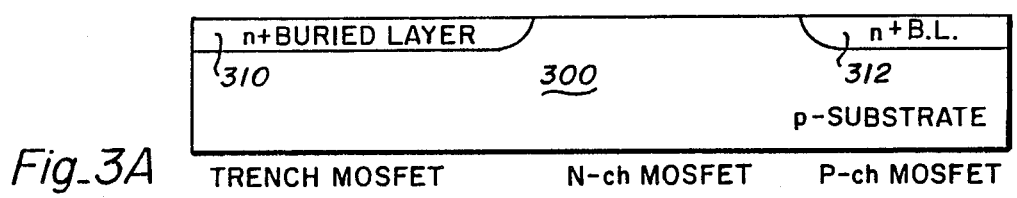
Fig_3A
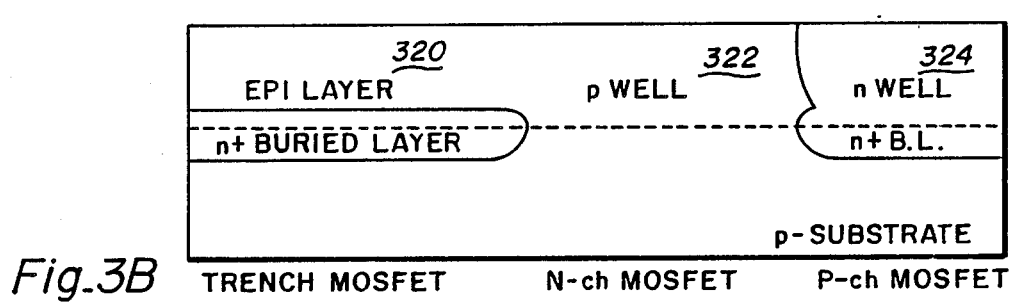
Fig_3B
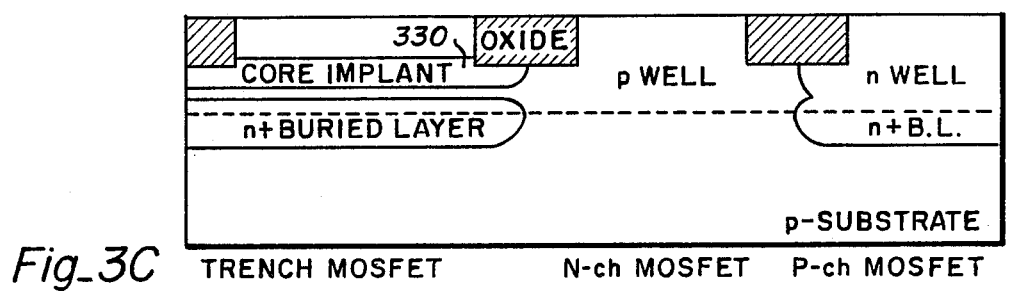
Fig_3C
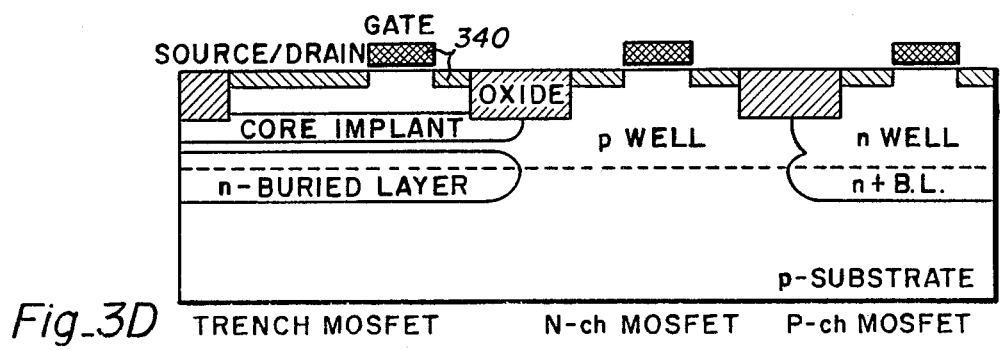
Fig_3D

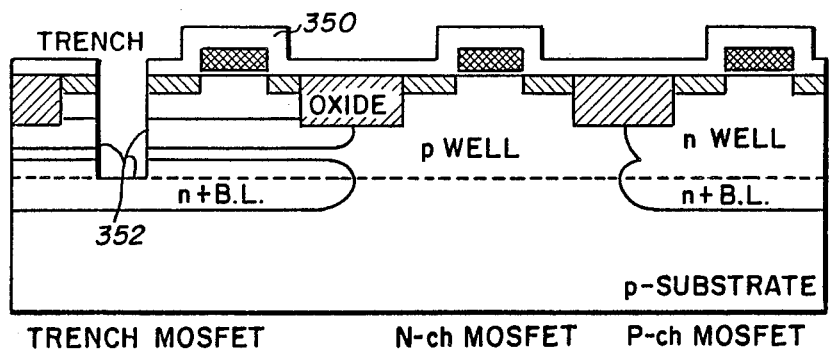
Fig._3E
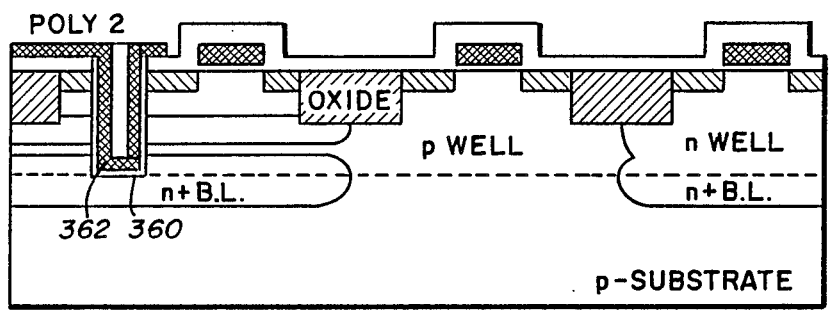
Fig._3F
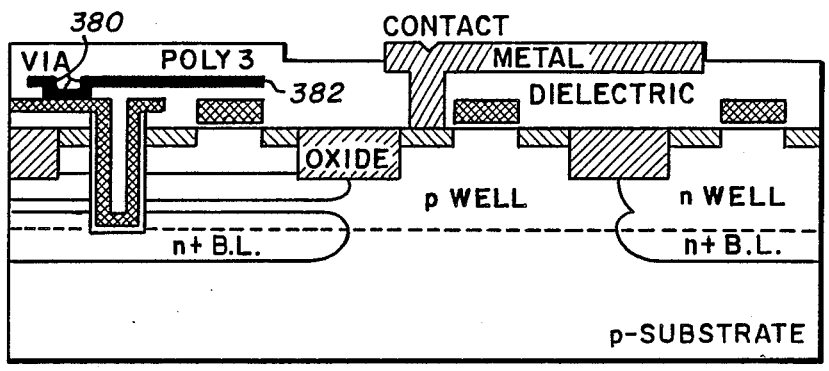
Fig._3G
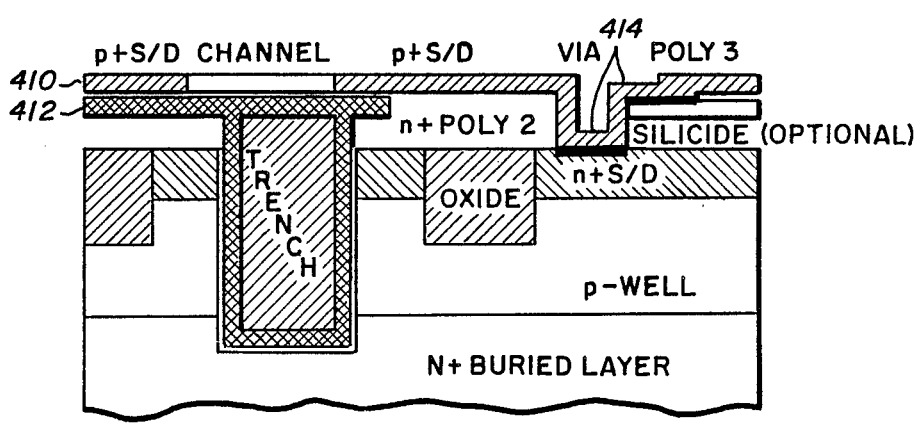
Fig._4

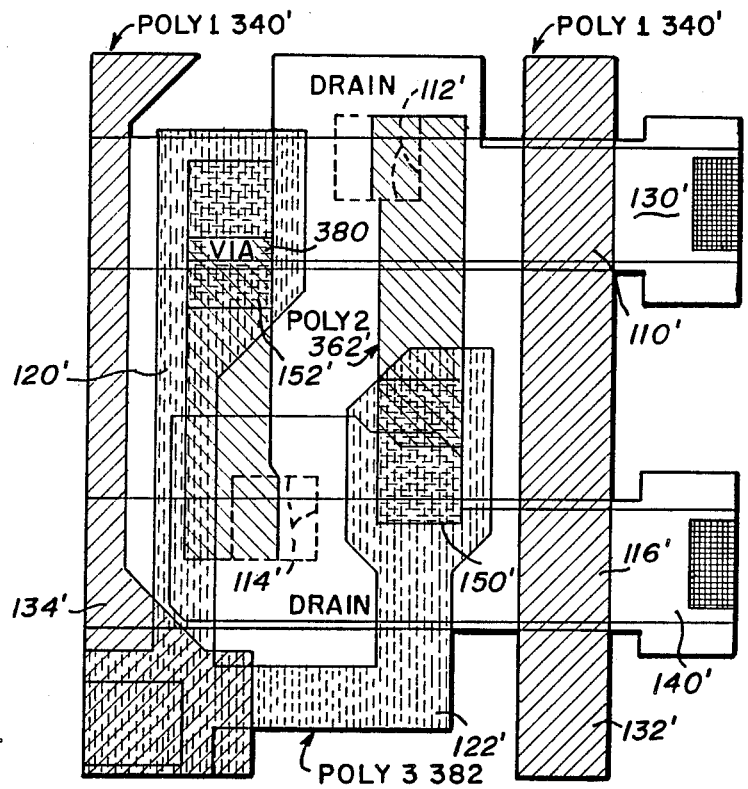
Fig_5
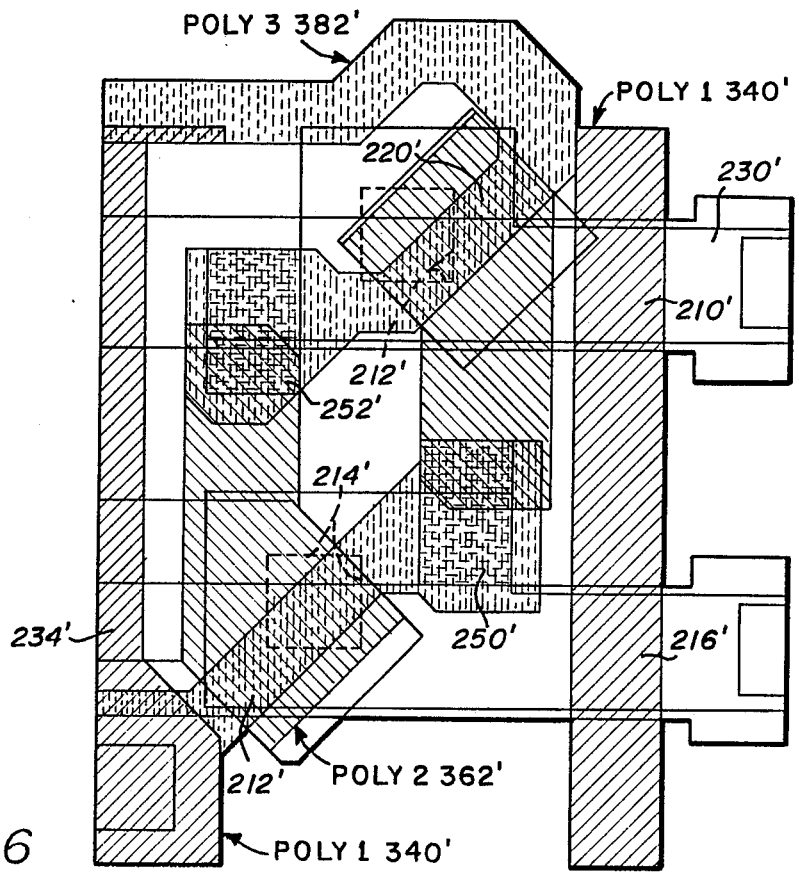
Fig_6

METHOD OF MAKING A STATIC RAM CELL WITH TRENCH PULL-DOWN TRANSISTORS AND BURIED-LAYER GROUND PLATE

This is a divisional of co-pending application Ser. No. 069,168 filed on July 2, 1987.

TECHNICAL FIELD

The present invention relates to integrated circuit type devices generally and more specifically to a static, random acces memory cell with trench pull-down transistors and buried-layer ground plate.

BACKGROUND ART

Static, random access memories (SRAMs) employ a number of cells, each for storing a single binary bit of information. Typical SRAM cell structures include what is commonly referred to as a four transistor, two resistor (4R-2R) SRAM cell and what is commonly referred to as a six transistor (6T) SRAM cell. A (4R-2R) SRAM cell is illustrated in (prior art) FIG. 1 of the drawing generally designated by the number 100. SRAM cell 100 is shown to include four, N-channel, transistors, which are designated 110, 112, 114, and 116, and two (load) resistors, which are designated 120 and 122. Transistor 110 is configured as a transfer transistor with the transistor source (or drain) connected to a bit (input) line, which is designated 130. The gate of transistor 110 is connected to a word (control) line, which is designated 132. The drain (or source) of transistor 110 is coupled by resistor 120 to the power supply potential, which is represented by a line 134. Transistor 112 is configured as a pull-down transistor with the transistor source connected to circuit ground, with the transistor gate coupled by resistor 122 to power supply line 134, and with the transistor drain connected to the drain of transistor 110. Transistor 114 is also configured as a pull-down transistor with the transistor source connected to circuit ground, with the transistor gate connected to the drain of transistor 110, and with the transistor drain connected to the gate of transistor 112. Finally, transistor 116 is also configured as a transfer transistor with the transistor source connected to the gate of transistor 112, with the transistor gate connected to word line 132, and with the transistor drain connected to a bit (output) line, which is designated 140. The lines connecting the cross-coupling gates and drains of the pull-down transistors are designated 150 and 152.

A six transistor (6T) SRAM cell is illustrated in (prior art) FIG. 2 generally designated by the number 200. SRAM cell 200 is shown to include four, N-channel, transistors, which are designated 210, 212, 214, and 216, and two, P-channel, (load) transistors, which are designated 220 and 222. The transistors are configured with the source of transistor 210 connected to a bit (input) line, which is designated 230, with the transistor gate connected to a word (control) line, which is designated 232, and with the transistor drain connected to a node which is connected to the source of transistor 220, to the drain of transistor 212, and to the gate of both transistors 214 and 222. Connected to another node is the gate of both transistors 220 and 212, the source of transistors 222, the drain of transistor 214, and the source of transistor 216. The drain of both transistors 220 and 222 are connected to the power supply potential, which is represented by a line 234; and, the source of both transistors 212 and 214 are connected to circuit ground. The gate of transistor 216 is connected to word line 232; and, the drain of the transistor is connected to a bit (output) line, which is designated 240.

In the implementation of high density SRAMs, the cell size is one of the more critical parameters, as it determines the total area of the memory array and, therefore, the chip size. For poly-silicon-resistor load (4R-2R) SRAM cells, the first poly-silicon layer and the active island layer, which define the pull-down transistor that is designated 114 in FIG. 1 and the transfer transistor that is designated 116 in FIG. 1, ultimately become the limiting layers in determining the cell size for array sizes larger than one million bits. In the conventional planar layout, the size of the pull-down transistor (114) accounts for a significant portion of the cell area. This is because the pull-down transistor (114) size must be around three times that of the transfer transistor (116) to prevent the state of the cell from being upset when transfer transistor (116) is turned on when the state of the cell is being read. The drawn gate width of the pull-down transistor also needs to include the portion that extends over the field region to account for misalignment and critical dimension variation. The need to connect the cross-coupled gates and drains of the pull-down transistors (112 and 114) further aggravates the layout density problem. In addition, the need to pick up the sources of the pull-down transistors (112 and 114) requires additional active island area and metal interconnect.

In dynamic RAMs (DRAMs) the trench has been used to implement the storage capacitor. (See, for example, M. Wada et al, "A Folded Capacitor Cell (F.C.C) For Future Megabit DRAMs," IEDM Tech. Dig., p. 244–247 (1984); Shigeru Nakajima et al, "An Isolation-Merged Vertical Capacitor Cell For Large Capacity DRAM," IEDM Tech. Dig., p. 240–243 (1984); and Kunio Nakamura et al, "Buried Isolation Capacitor (BIC) Cell For Megabit MOS Dynamic RAM," IEDM Tech. Dig., p. 236–239 (1984).) More recently, the trench has been used to implement both the storage capacitor and the transfer transistor in high density DRAMs. (See, for example, W. F. Richardson et al, "A Trench Transistor Cross-Point DRAM Cell," IEDM Tech. Dig., p. 714–717.) In the latter case, the substrate is used as a ground plate for the capacitor. A very deep trench as well as a very complicated refill/etch/refill process is required to achieve the desired structure. Both the capacitor capacity and the transistor channel length vary in proportion to the trench depth and the variations in the refill/etch/refill processes. Also, the basic DRAM cell concepts do not apply directly to SRAM cells.

For static RAMs, a cell with poly-silicon load resistor implemented in the trench has been proposed to solve the layout density problem of the second poly-silicon (resistor) layer. (See, for example, Yoshio Sakai et al, "A Buried GigaOhm Resistor (BGR) Load Static RAM Cell, Tech. Dig., Symposium On VLSI Tech., p. 6–7 (1984).) This approach, however, does not solve the first poly-silicon layer and the active island layer layout density problems which are more critical in SRAM's with one million bits or more. In fact, this buried-gigaohm load resistor occupies additional island area compared to that of conventional planar layouts.

The reader may also find of interest Daisuke Ueda et al, "Deep-Trench Power MOSFET With An Ron Area Product Of 160 mohms-square mm," IEDM Tech.

Dig., p. 638–641 (1986); H-R Chang et al, "Ultra Low Specific On-Resistance UMOS FET," IEDM Tech. Dig., p. 642-645 (1986); Antoine Tamer et al, "Numerical Comparison Of DMOS Power Transistors," IEEE T-ED vol. ED-30 no. 1, p. 73-76 (Jan. 1983); and Satwinder Malhi et al, "Characteristics and Three-Dimensional Integration Of MOSFET's In Small-Grain LPCVD Polycrystalline Silicon," "IEEE T-ED vol. ED-32 no., section IX, p. 273–281 (2 Feb. 1985).

DISCLOSURE OF THE INVENTION

The primary object of the present invention is to provide a SRAM cell of minimum size.

Another object of the present invention is to provide a SRAM cell which does not require a complicated refill/etch/refill process.

Still another object of the present invention is to provide a SRAM cell the length of the channel of the transistors of which is relatively insensitive to variations in the trench depth.

Briefly, in addition to the conventional steps, the presently preferred method of producing a SRAM cell with trench pull-down tranistors and buried-layer ground plate in accordance with the present invention employs the steps of forming an isolated, buried, n+ layer on a p-substrate, growing an epitaxial silicon layer on the substrate, performing a memory core deep implant, and forming trenchs.

These and other objects of the present invention will no doubt become apparent to those skilled in the art after having read the detailed description of the presently preferred embodiments of the present invention which is illustrated in the figures of the drawing.

BRIEF DESCRIPTION OF THE FIGURES IN THE DRAWING

FIG. 1 is a schematic diagram of a prior art type (4R-2R) SRAM cell;

FIG. 2 is a schematic diagram of a prior art type (6T) SRAM cell;

FIGS. 3A-3G are cross-section views of a silicon chip illustrating the steps associated with producing the presently preferred embodiment of a SRAM cell with trench pull-down transistors and buried-layer ground plate in accordance with the present invention;

FIG. 4 is a cross-section view of a silicon chip illustrating the steps associated with producing another presently preferred embodiment of a SRAM cell with trench pull-down transistors and buried-layer ground plate in accordance with the present invention;

FIG. 5 is an elevation view of the layout of the presently preferred embodiment of a (4R-2R) SRAM cell with trench pull-down transistors and buried-layer ground plate in accordance with the present invention; and FIG. 6 is an elevation view of the layeout of the presently preferred embodiment of a (6T) SRAM cell with trench pull-down transistors and buried-layer ground plate in accordance with the present invention.

BEST MODE FOR CARRYING OUT THE INVENTION

The steps associated with producing the presently preferred embodiment of a SRAM cell with trench pull-down transistors and a buried-layer ground plate in accordance with the present invention are illustrated in FIGS. 3A–3G of the drawing. Specifically, on a p-substrate, which is designated 300 in FIG. 3A, an isolated, buried, n+ layer, designated 310, is formed underneath what is to become the cell (memory array). The n+ buried layer, 310, is to be used as the ground plate (plane) of the cell (memory array) for connection to the source of the pull-down transistors, which are designated 112 and 114 in FIG. 1 and 212 and 214 in FIG. 2.

Next, in conventional fashion, an epitaxial silicon layer, designated 320 in FIG. 3B, is grown to a thickness of about 1.7 micrometers; n- and p- well regions, designated 322 and 324, respectively, are formed (diffused); and, active island regions are formed.

Then, a memory core deep implant, designated 330 in FIG. 3C, is performed to adjust the threshold voltage of the pull-down transistors.

Next, in conventional fashion, the first poly-silicon layer gate and source/drain regions, designated 340 in Figure 3D, of the transfer transistors, which are designated 110 and 116 in FIG. 1 and 210 and 216 in FIG. 2, are formed.

Thereafter, CVD oxide is deposited, designated 350 in FIG. 3E, as a masking layer for trench formation. Then, trenches, designated 352, are etched to a depth of about 1.5 micrometers so that the bottom of the trench is inside the buried layer and the channel length of the trench (pull-down) transistors is independent of trench depth variations.

Gate oxidation, designated 360 in FIG. 3F, is, subsequently, formed; and, a second poly-silicon layer, designated 362, of about 100 nanometers is deposited, forming the gate electrode for the trench (pull-down) transistors. Due to the heavily doped n+ island and buried layer, the oxidation rate at the top and the bottom of the trench is enhanced which alleviates the oxidation retardation phenomenon occurring at corners. The oxide thickness of the trench (pull-down) transistors is adjusted independently of that of the transfer transistors to obtain an optimum drive ratio between the pull-down and the transfer transistors.

CVD oxide is then deposited and etched back to planarize the trench; and, the second poly-silicon layer is patterned by dry etching. CVD oxide of about 200 nanometers is then deposited and patterned to form the via holes, designated 380 in FIG. 3G; and, the third poly-silicon layer, designated 382, of 80 nanometers is formed (deposited). The third polysilicon layer is then patterned and implanted to form load resistors and interconnections followed by insulators, contact hole openings, metal line definitions and passivations.

Because the second poly-silicon layer (gate of the trench transistors) is not the area-limiting layer, it is drawn bigger in another embodiment. Then, the third poly-silicon layer (410) is laid out directly on top of the second polysilicon layer (412) forming non-self-aligned p-channel polysilicon (load) transistors. This would usually result in significantly larger cell size using conventional planar layout methodology. In the embodiment illustrated in Figure 4, the silicidation at the via openings (414) shorts out the forward-biased p+/n+ poly-silicon diodes and lowers the cell holding voltage.

The layout of the presently preferred embodiment of the SRAM cell with trench pull-down transistors and buried-layer ground plate with poly-silicon load resistors (4R-2R) is shown in FIG. 5; and, and the layout of the presently preferred embodiment of the SRAM cell with trench pull-down transistors and buried-layer ground plate with poly-silicon p-channel (load) transistors (6T) is shown in FIG. 6. For clarity, in FIGS. 5 and 6, the various components are designated by numbers comparable to those used for analogous components shown in FIGS. 1 and 2. The substrate and the n+ buried ground plate pickup is done surrounding the memory array and, occasionally, going through the array with little impact on the overall memory array area.

It is important to note that by implementing each of the pull-down transistors vertically in a trench, the perimeter of the trench becomes the width of the respective pull-down transistor. Thus, there is no gate extension required as each transistor is enclosed without edges. Further, the isolated, buried, n+ layer under the array lies at the bottom of the trench serving both as the source of the trench pull-down transistors and as the ground interconnection. No ground pick-up is required in the memory cell. The resulting cell is very compact and occupies (typically) 65%, or less, of the area occupied by a cell achieved using a conventional planar layout. In addition to much smaller cell size, the trench SRAM cell also provides better alpha-immunity due to increased node capacitance (second poly-silicon gate to buried-layer ground plate) and better radiation hardness owing to the lack of edges in the pull-down transistors. In terms of process complexity, as compared to the conventional process, the additional steps associated with fabricating the SRAM cell with trench pull-down transistors and a buried-layer ground plate that are required include: the formation of the n+ buried layer (310) (1 masking step); the growth of the epitaxial layer (320); the core threshold implantation (330) (1 masking step); and the trench formation (352) (1 masking step). Only the latter step involves a critical masking step. In an embodiment using a merged Bipolar/CMOS process, only the last two steps are additional steps.

In the presently preferred embodiment, the following parameters are employed:

| | |
|---|---|
| (1) n+ Buried Layer | Arsenic or Antimony ion-implanted with a dose of 5 times ten to the fifteenth per square centimeter |
| (2) Epitaxial Silicon | 1.7 micron thickness, 1-ohm-centimeter P-type resistivity |
| (3) Core Deep Implant | Boron, 300 kev, dose of 2 times ten to the twelfth per square centimeter |
| (4) n+ Source/Drain | 0.25 micron junction depth |
| (5) CVD Trench Masking Oxide | 1500 angstroms thickness |
| (6) Trenches | 1.5 microns depth, 1.2 microns square |
| (7) Trench Gate Oxide | 250 angstroms thermal oxide |
| (8) Second Polysilicon | 1000 angstroms, doped phosphorus |
| (9) CVD Planarization Oxide | 0.8 microns thickness |
| (10) CVD Inter-Poly Oxide | 2000 angstroms thickness |
| (11) CVD Inter-Poly Oxide | 300 angstroms thickness P-channel poly-silicon gate oxide |
| (12) Third Polysilicon | 800 angstroms thickness |

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. In a method of fabricating a SRAM cell, of the type wherein p- well regions, active island regions, conductive layers, loads, interconnections, insulators, contact hole openings, metal line definitions, and passivations are all formed on an epitaxial silicon layer, the improvement comprising in combination the steps of:
    forming an isolated, buried, n+ layer on a p- substrate;
    growing the epitaxial silicon layer on said substrate;
    forming p- well regions in said grown epitaxial silicon layer;
    forming active island regions in said grown epitaxial silicon layer;
    performing a pull-down transistor threshold voltage adjustment;
    masking for trench formation;
    etching at least one trench into said grown epitaxial silicon layer so that the bottom of said trench is inside said buried layer;
    forming a dielectric in said trench; and
    forming a conductive layer as a gate electrode for a trench transistor.

2. A method of fabricating a SRAM cell comprising in combination the steps of:
    forming an isolated, buried, n+ layer on a p- substrate;
    growing an epitaxial silicon layer on said substrate
    forming p- well regions in said grown epitaxial silicon layer;
    forming active island regions in said grown epitaxial silicon layer;
    forming a first conductive layer on said grown epitaxial silicon layer for transistor gates sources and drains;
    masking for trench formation;
    etching at least one trench into said grown epitaxial silicon layer so that the bottom of said trench is inside said buried layer;
    forming a dielectric in said trench;
    forming a second conductive layer as a gate electrode for a trench transistor;
    patterning said second conductive layer;
    forming a dielectric for at least one via hole;
    patterning said via hole dielectric to form said via hole;
    forming a third conductive layer;
    patterning said third conductive layer; and
    implanting to form loads and interconnections followed by insulators, contact hole openings, metal line definitions and passivations.

3. A method of fabricating a SRAM cell as recited in claim 2 wherein before the step of patterning said second conductive layer is performed, the step of forming an additional conductive layer is performed directly on top of said second poly-silicon layer so as to form gate electrodes for non-self-aligned p-channel poly-silicon transistors.

4. A method of fabricating a SRAM cell comprising the combination the steps of:
    forming an isolated, buried, n+ layer on a p- substrate;
    growing an epitaxial silicon layer on said substrate;
    forming p- well region in said grown epitaxial silicon layer;
    forming active island regions in said grown epitaxial silicon layer;
    performing a pull-down transistor threshold voltage adjustment;

forming a first conductive layer on said grown epitaxial silicon layer for transistor gates sources and drains;
depositing a masking layer for trench formation;
etching at least one trench into said grown epitaxial silicon layer so that the bottom of said trench is inside said buried layer;
forming a dielectric in said trench;
forming a second conductive layer as a gate electrode for a trench transistor;
depositing material for use in planarizing said trench;
etching back said trench planarizing material to planarize said trench;
patterning said second conductive layer;
depositing a masking layer for at least one via hole;
patterning said via hole masking layer to form said via hole;
forming a third conductive layer;
patterning said third conductive layer; and
implanting to form loads and interconnections followed by insulators, contact hole openings, metal line definitions and passivations.

5. A method of fabricating a SRAM cell as recited in claim 4 wherein before the step of patterning said second conductive layer is performed, the step of forming an additional conductive layer is performed directly on top of said second poly-silicon layer so as to form gate electrodes for non-self-aligned p-channel poly-silicon transistors.

* * * * *